(12) United States Patent
Tchagaspanian

(10) Patent No.: US 7,642,860 B2
(45) Date of Patent: Jan. 5, 2010

(54) CURRENT PRE-AMPLIFIER AND ASSOCIATED CURRENT COMPARATOR

(75) Inventor: Michael Tchagaspanian, St Ismier (FR)

(73) Assignee: Commissariat a l'Energie Atomique, Paris (FR)

(*) Notice: Subject to any disclaimer, the term of this patent is extended or adjusted under 35 U.S.C. 154(b) by 54 days.

(21) Appl. No.: 11/950,124

(22) Filed: Dec. 4, 2007

(65) Prior Publication Data

US 2008/0136525 A1      Jun. 12, 2008

(30) Foreign Application Priority Data

Dec. 7, 2006    (FR)    ..................... 06 55366

(51) Int. Cl.
*H03F 3/08* (2006.01)
*H03F 3/68* (2006.01)

(52) U.S. Cl. ...................... 330/308; 330/311
(58) Field of Classification Search ............... 330/98, 330/99, 100, 290, 308, 311
See application file for complete search history.

(56) References Cited

U.S. PATENT DOCUMENTS 4,882,548 A * 11/1989 Marrah et al. ............... 330/288
5,469,104 A * 11/1995 Smith et al. ................. 327/491

FOREIGN PATENT DOCUMENTS

JP      10-284955      10/1998
JP      2002-335133    11/2002

OTHER PUBLICATIONS

Byung-moo Min, et al., "High Performance CMOS Current Comparator Using Resistive Feedback Network", Electronics Letters, XP 006010488, vol. 34, No. 22, Oct. 29, 1998, pp. 2074-2076.
A.T.K. Tang, et al., "High Performance CMOS Current Comparator", Electronics Letters, vol. 30, No. 1, Jan. 6, 1994, pp. 5-6.
H. Traff, "Novel Approach to High Speed CMOS Current Comparators", Electronics Letters, vol. 28, No. 3, Jan. 30, 1992, pp. 310-312.
Lu Chen, et al., "A High Speed / Power Ratio Continuous-Time CMOS Current Comparator", IEEE, 2000, pp. 883-886.

* cited by examiner

*Primary Examiner*—Steven J Mottola
(74) *Attorney, Agent, or Firm*—Oblon, Spivak, McClelland, Maier & Neustadt, L.L.P.

(57) ABSTRACT

A current pre-amplifier with an input capable of receiving or supplying an input current with at least one pulse, wherein the pre-amplifier includes a regulated cascode stage including an input transistor and a first current generator as well as an output transistor and a second current generator. The pre-amplifier includes a detection device capable of detecting an input current pulse, and a feedback device capable of increasing the current supplied by the first and/or the second current generator during the entire detection of the input current pulse.

17 Claims, 5 Drawing Sheets

CURRENT PRE-AMPLIFIER AND ASSOCIATED CURRENT COMPARATOR

TECHNICAL FIELD AND PRIOR ART

The invention relates to a current pre-amplifier and a current comparator that comprises a current pre-amplifier. This invention relates more specifically to a pre-amplifier of a pulse type current, which is to say a current with high frequency variations.

The current comparator of the invention is a rapid current comparator with low consumption.

The current comparator of the invention applies to all fields where it is important to have very short circuit response times and where low consumption of the circuits is desired. By way of non restrictive example, the invention will be described more particularly in the field of imaging, a field in which images in relief are formed from signals supplied by detecting pixel matrices.

The performances of the rapid current comparators of the known art are provided in the table below:

| Comparator | Stimuli in input 10 nA | | Stimuli in input 100 nA | |
|---|---|---|---|---|
| | Response times | Consumption | Response times | Consumption |
| [1] | 13 ns | 560 µW | 8 ns | 400 µW |
| [2] | 500 ns | 130 µW | 80 ns | 120 µW |
| [3] | 21 ns | 575 µW | 10 ns | 460 µW |
| [4] | 14 ns | 580 µW | 9 ns | 560 µW |

The comparator [1] is revealed by the document "A high speed/power ratio continuous-time CMOS current comparator", Lu Chen, Bingxue Shi and Chun Lu, IEEE 2000, pp 883-886.

The comparator [2] is revealed by the document "Novel approach to high speed CMOS current comparator", Traff H, Electron. Lett. 1992, 28, (3), pp. 310-312.

The comparator [3] is revealed by the document "High performance CMOS current comparator", Tang, ATK, and Toumazou C, Electron. Lett, 1994, 30, (1), pp. 5-6.

The comparator [4] is revealed by the document "High performance CMOS current comparator using resistive feedback network", B. M. Min and S. W. Kim, Electron. Lett, vol. 34, No 22, pp. 2074-2076, 1998.

All of the comparators [1], [2], [3], [4] are based on the principle of a CMOS inverter counter reacted by an electronic circuit permitting the inverter to be polarised in a perfect balance around the switch point.

These comparators provide very variable performances in terms of rapidity depending on the position and dimensions of the static polarisations. In fact, to achieve good performances in terms of rapidity, they require the use of high static consumption, for example more than 500 µW to pass under the threshold of 20 ns response times for an input pulse of ±10 nA (see table above).

This is a disadvantage. The traditional architectures are therefore not satisfactory. Their limits have been reached.

DESCRIPTION OF THE INVENTION

The invention does not have the above disadvantages.

The invention provides a current pre-amplifier with an input capable of receiving or supplying an input current with at least one pulse, wherein the pre-amplifier comprises a regulated cascode stage comprising an input transistor and a first current generator in series at the terminals of a power supply, as well as an output transistor and a second current generator in series at the terminals of said power supply, wherein the first intermediate node between the first current generator and the input transistor constitutes said input and is connected to the command terminal of the output transistor, wherein the second intermediate node between the second current generator and the output transistor is connected to the command terminal of the input transistor, the pre-amplifier further comprising:

- detection means capable of detecting an input current pulse,
- first feedback means capable of increasing the current supplied by the first current generator during the entire detection of the input current pulse, and/or
- second feedback means capable of increasing the current supplied by the second current generator during the entire detection of an input current pulse.

According to one embodiment of the above-mentioned current pre-amplifier, the detection means capable of detecting an input current pulse comprise a diode connected detection transistor placed between said input transistor and a terminal of said power supply.

According to one embodiment of the above-mentioned current pre-amplifier, the first current generator comprises first and second current mirror mounted transistors, wherein the first transistor is placed between the input of the pre-amplifier and a terminal of said power supply, wherein the second transistor is diode connected and has a pre-defined polarisation current passing through it.

According to one embodiment of the above-mentioned current pre-amplifier, the first feedback means comprise:
- a third transistor connected to the detection transistor has the form of a current mirror, wherein the command terminal of the third transistor is connected to the command terminal of the detection transistor,
- a fourth diode connected transistor placed in series with the third transistor at the terminals of said power supply,
- a first capacitor placed between the command terminals of the first and fourth transistors, and
- a first resistor placed between the command terminals of the first and second transistors.

According to another embodiment of the above-mentioned current pre-amplifier, the second current generator comprises fifth and sixth current mirror mounted transistors, wherein the fifth transistor is placed between said second intermediate node and a terminal of said power supply, wherein the sixth transistor is diode connected and has a pre-defined polarisation current passing through it.

According to another embodiment of the above-mentioned current pre-amplifier, the second feedback means comprise:
- a second capacitor placed between the command terminals of the detection transistor and the fifth transistor, and
- a second resistor placed between the command terminals of the fifth and sixth transistors.

This invention further provides a current comparator comprising a current pre-amplifier and a current/voltage converter in series with the current pre-amplifier, wherein the current pre-amplifier is made according to one of the above-mentioned embodiments.

According to one embodiment of the comparator, the current/voltage converter comprises additional first and second transistors of different types mounted in series at the terminals of said power supply, wherein the additional transistors are connected at an output node of the current/voltage converter, wherein a capacitor connects the command terminals of the additional transistors, wherein the command terminals of the detection transistor and the first additional transistor are connected to one another, wherein a resistor is placed between the command terminals of said second transistor and the second additional transistor.

According to one embodiment, the above-mentioned current comparator comprises a voltage comparator in series with the voltage/current converter.

According to one embodiment of the above-mentioned current comparator, the voltage comparator comprises:
- a first transistor of a first type in series with a first current source at the terminals of a power supply, wherein the intermediate node between the first transistor and the first current source forms the output of the voltage comparator,
- a second transistor of a second type placed between a terminal of said power supply and the command terminal of the first transistor, wherein the command terminal of the second transistor is connected to said output of the voltage comparator,
- a third transistor of the first type diode connected, wherein the third transistor is in series with a current source at the terminals of said power supply,
- a resistor placed between the command terminals of the first and third transistors, and
- a capacitor placed between the command terminal of the first transistor and the input of the voltage comparator, and in which the input of the voltage comparator is connected to the output node of the current/voltage converter.

This invention further provides a photonic integration circuit comprising a current comparator such as those described above.

The invention also relates to a photonic integration circuit comprising a current comparator according to the invention.

One of the applications of the circuit of the invention is relief imaging. A light source illuminates an object and with the aid of a detecting pixel matrix, the flight time of the photons reflected by the object is measured. By means of this measurement, it is possible to reconstruct the relief of the object. The difficulty therefore lies in the rapidity of the measurement. The current comparator of the invention advantageously satisfies this rapidity requirement. Furthermore, the comparator of the invention consumes very little current, which is particularly advantageous as it is carried by each pixel of the imaging device.

BRIEF DESCRIPTION OF THE FIGURES

Other characteristics and advantages of the invention will become clearer upon reading one preferred embodiment of the invention made in reference to the attached figures among which.

In all the figures, the same references are used to designate the same elements.

DETAILED DESCRIPTION OF EMBODIMENTS OF THE INVENTION

Figure 1:
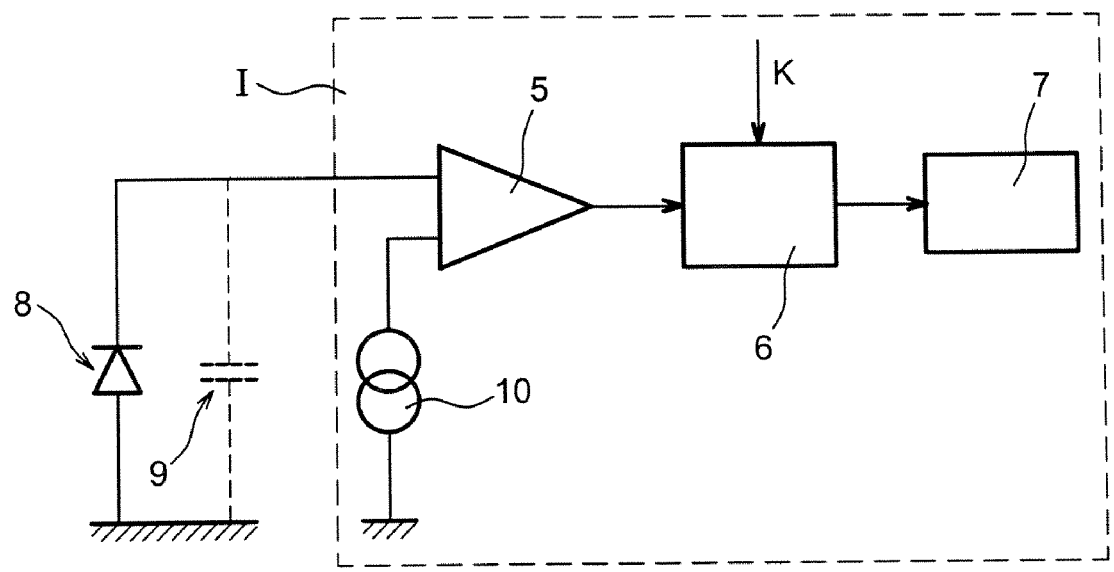
FIG. 1 shows a block diagram of a photonic integration circuit of an imaging system.

FIG. 1 shows a block diagram of a photonic integration circuit of an imaging system. The photonic integration circuit I comprises a current comparator 5, a digital meter 6 and a memory 7. A first input of the current comparator 5 is connected to a detecting photodiode 8 and a second input is connected to a reference current source 10 with a very low value with respect to the current values that may pass through the photodiode following the detection of a photon. The photodiode 8 has a parasite capacity that is shown, symbolically, by a capacitor 9 drawn in dotted lines.

The photonic integration circuit I dates the current supplied by the photodiode 8 by sampling the digital meter 6 using the signal supplied by the current comparator 5. The digital meter 6 is initially reset to zero using an external command K. The counting begins. When the photons arrive, the photonic current from the photodiode 8 causes the current comparator 5 to switch. The latter then supplies a signal which stops the counting and the numerical value supplied by the counter is stored in the memory 7.

The numerical values associated to the different detecting pixels are then compared and the relief of the imaged object is deduced.

The photonic current may be extremely low. Whereas in fact, the parasite capacity of the photodiode 8 has quite a high value. Part of the current supplied by the photodiode 8 then circulates in the parasite capacitor 9. In order for the current supplied by the photodiode 8 to be restored optimally to the comparator, the latter must have a low impedance value.

Furthermore, two neighbouring pixels may simultaneously receive photon flows with large differences in levels that are due, not to the depth of the relief of the imaged object, but to a difference in reflectivity of the two neighbouring points of the object. It is therefore preferable for the current comparator not to supply erroneous information in spite of this difference in flow. In order to reduce the measurement error, ideally the current comparator will be triggered as quickly as possible.

Figure 2:
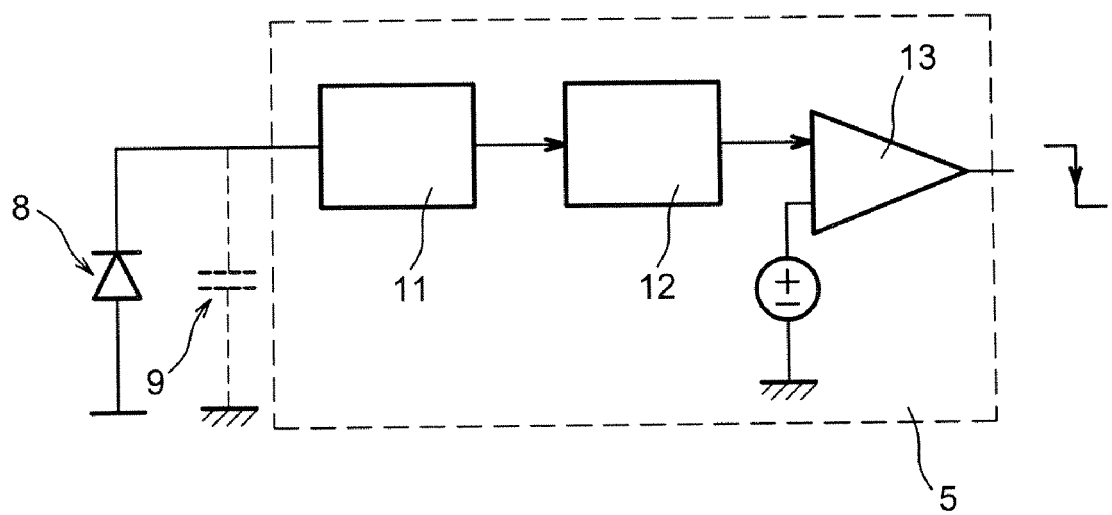
FIG. 2 shows a block diagram of a rapid current comparator according to the invention.

FIG. 2 shows a block diagram of a current comparator. Consequently, this block diagram relates both to a current comparator of the prior art and a current comparator of the invention. The current comparator comprises several elementary circuits mounted in series, which is to say a current pre-amplifier 11, a current/voltage converter 12 and a voltage comparator 13. As may be seen in the following description, the invention relates to each of the elementary circuits that are part of the current comparator.

Figure 3:
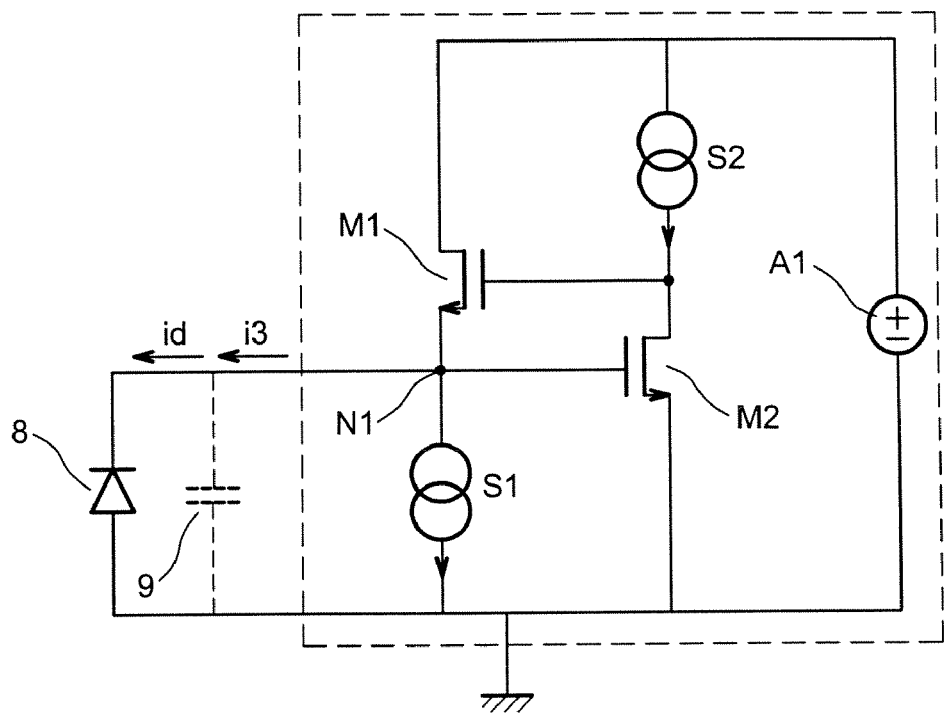
FIG. 3 shows a basic electronic circuit that is part of the current comparator of the invention.

FIG. 3 shows a basic electronic circuit that is part of the current pre-amplifier of the invention.

The basic electronic circuit of FIG. 3 is a circuit that is in itself known by the name of "regulated cascode stage". According to the preferred embodiment of the invention, the regulated cascode stage uses CMOS technology. The regulated cascode stage comprises an input transistor M1 (N type MOS transistor), a first current generator S1 that supplies a current I1, an output transistor M2 (N type MOS transistor), a second current generator S2 that supplies a current I2 and a power supply A1. The input transistor M1 and the first current generator S1 are mounted in series at the terminals of the power supply A1, wherein the transistor drain M1 is connected to the positive terminal of the power supply A1. The second current generator S2 and the output transistor M2 are mounted in series at the terminals of the power supply A1, wherein the transistor source M2 is connected to the negative terminal of the corresponding power supply A1, in this example, to the ground. The gate of the transistor M1 is connected to the transistor drain M2 and the transistor source M1 forms the input node N1 of the current pre-amplifier and consequently of the current comparator. The node N1 is connected to the photodiode. In this example, the photodiode is placed between the node N1 and the ground, the anode of the photodiode being on the ground side.

Such a circuit may have an input impedance of a very low value and this is why it satisfies one of the demands of the invention mentioned above.

As previously mentioned, there is a competitive effect which occurs between the parasite impedance of the photodiode due to the presence of the parasite capacitor 9 (for example a 100 fF capacitor) and the impedance of the comparator, which is to say the input impedance of the regulated cascode stage.

The pulse current id circulating in the photodiode 8 is instantaneously issued from the parasite capacitor 9 which is slightly discharged. The parasite capacitor 9 is then recharged progressively, by means of a current i3 supplied by the regulated cascode stage. Consequently, at most the input impedance of the regulated cascode stage is low compared to the parasite impedance of the capacitor 9, at most the current i3 increases rapidly. The current i3 is a postponed image of the current id.

The input impedance of the regulated cascode assembly is controlled by the dynamic gain of the transistors M1 and M2 forming it and therefore by the polarisation currents I1 and I2 passing through the respective transistors M1 and M2. In fact:

$$1/Z_{in} = gds_1 \left[ 1 = \frac{gm_1}{gds_1}\left(1 + \frac{gm_2}{gds_2}\right)\right] \text{ where}$$

$Z_{in}$ is the input impedance of the cascode assembly, $gds_1$ and $gds_2$ are, respectively, the output conductances of the input and output transistors, and $gm_1$ and $gm_2$ are, respectively, the current gains of the input and output transistors.

After simplification of the above formula, it may be seen that 1/Zi is substantially proportional to gm1, wherein gm1 is proportional to the square root of I1.

In order for the impedance $Z_{in}$ to be low, the polarisation current I1 therefore needs to be high. the current I1 must however be limited due to the consumption constraints. Advantageously, the current pre-amplifier of the invention comprises means capable of increasing the polarisation current I1 by a value of current proportional to the input current i3 of the pre-amplifier. Therefore the polarisation current I1 of the transistor M1 is low as no detection is carried out and increases dynamically as soon as a current pulse occurs. An "excess consumption" of the polarisation current I1 then only occurs at the required moments, which is to say when there is the need "to listen" to the input signal. Apart from these moments, the consumption may be very low, as there is no detection.

Figure 4:
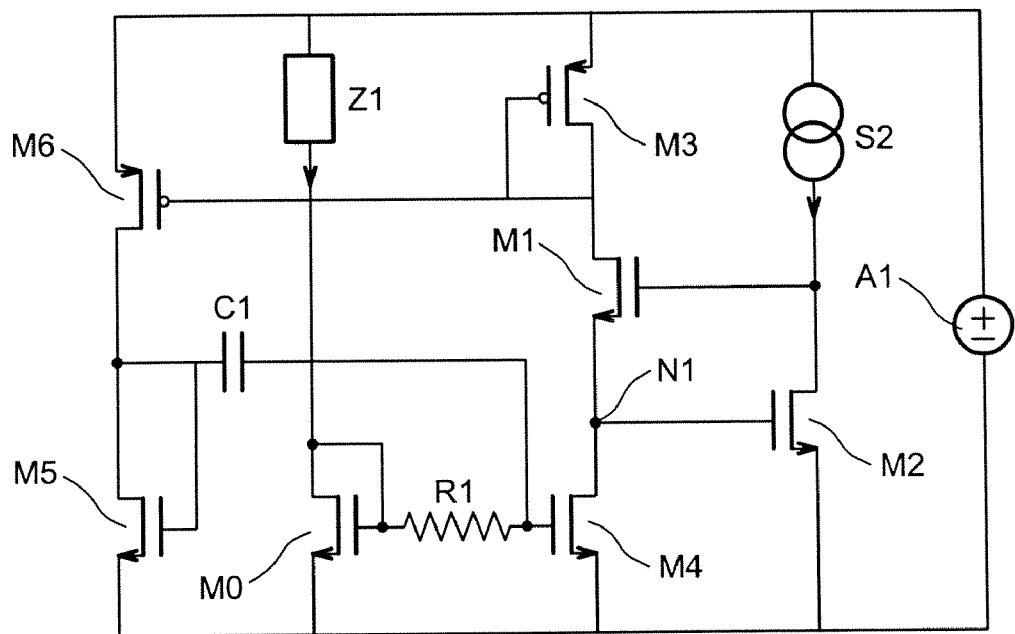
FIG. 4 shows a first example of a first electronic circuit that is part of the current comparator of the invention.

FIG. 4 shows a first example of a current pre-amplifier of the invention. In this example, the first current generator S1 is made using a current mirror. Furthermore, other elements are added to the elements shown in FIG. 3 in order to create detection means for a current call i3 and means for modifying the polarisation current I1 supplied by the first current generator S1. In this way, the current pre-amplifier shown in FIG. 4 features two P type CMOS transistors M3 and M6, three N type CMOS transistors M0, M4 and M5, a resistor R1 and a capacitor C1 and a load Z1. The transistors M0, M3 and M5 are diode connected.

The transistor M4 is placed between the node N1 and the ground. The load Z1 and the transistor M0 are placed in series at the terminals of the power supply A1. The transistor M0 is diode connected, and its source is connected to the ground. Furthermore, the diode connected transistor M3, is placed between the transistor drain M1 and the positive terminal of the power supply A1. The transistors M6 and M5 are placed in series at the terminals of the power supply A1, wherein the transistors are connected by their drains and the transistor M5 is diode connected. The gates of the transistors M3 and M6 are connected to one another. Furthermore, the capacitor C1 is placed between the gates of the transistors M4 and M5.

In the following description, by static current it is meant the current passing through a transistor outside of any current "call" on the input N1 of the pre-amplifier (i3=0) and by dynamic current, it is meant the variation in current, an increase or decrease, of the current passing through a transistor during the operation phases where a current i3 is supplied as the input of the pre-amplifier.

The first current generator S1 is made by the current mirror including the transistors M0 and M4. The choice of the load Z1 permits the current passing through the transistor M0 to be defined. The resistor R1 is placed between the gates of the transistors M0 and M4 so that the transistors M0 and M4 are a current mirror only for the static current. The static current passing through the transistor M4 thus copies the static current passing through the transistor M0. In other words, the current passing through the transistor M0 corresponds to the static value of the current I1 passing through the transistor M4 outside of any current call on the input N1 of the pre-amplifier.

The transistors M3 and M6 also form a current mirror. Furthermore, the current passing through the transistor M5 is substantially equal to the current passing through the transistor M6. The transistors M3, M6, and M5 by extension, form a current mirror for the static and dynamic currents. The static and dynamic currents passing through the transistor M6 or the transistor M5 thus copy the static and dynamic currents passing through the transistor M3. It may be noted that the current passing through the transistor M1 is identical to that passing through the transistor M3.

Moreover, the capacitor C1 connects the gates of the transistors M5 and M4 so that the transistors M5 and M4 form a current mirror solely for the dynamic currents. The dynamic current passing through the transistor M4 thus copies the dynamic current passing through the transistor M5.

With the help of this assembly, the regulated cascode stage comprises an avalanche type amplification loop that injects a dynamic current proportional to the current i3 in the polarisation current I1 of the transistor M4. The more the call current i3 increases, the more the input impedance decreases and the more the input current increases rapidly. In a manner that is known, the coefficient of proportionality between the dynamic current that reproduces the current i3 and the current i3 is related to the geometry of the transistors that form the different current mirrors. Within the scope of the invention, the coefficient of proportionality is preferably chosen to be greater than 1.

Figure 5:
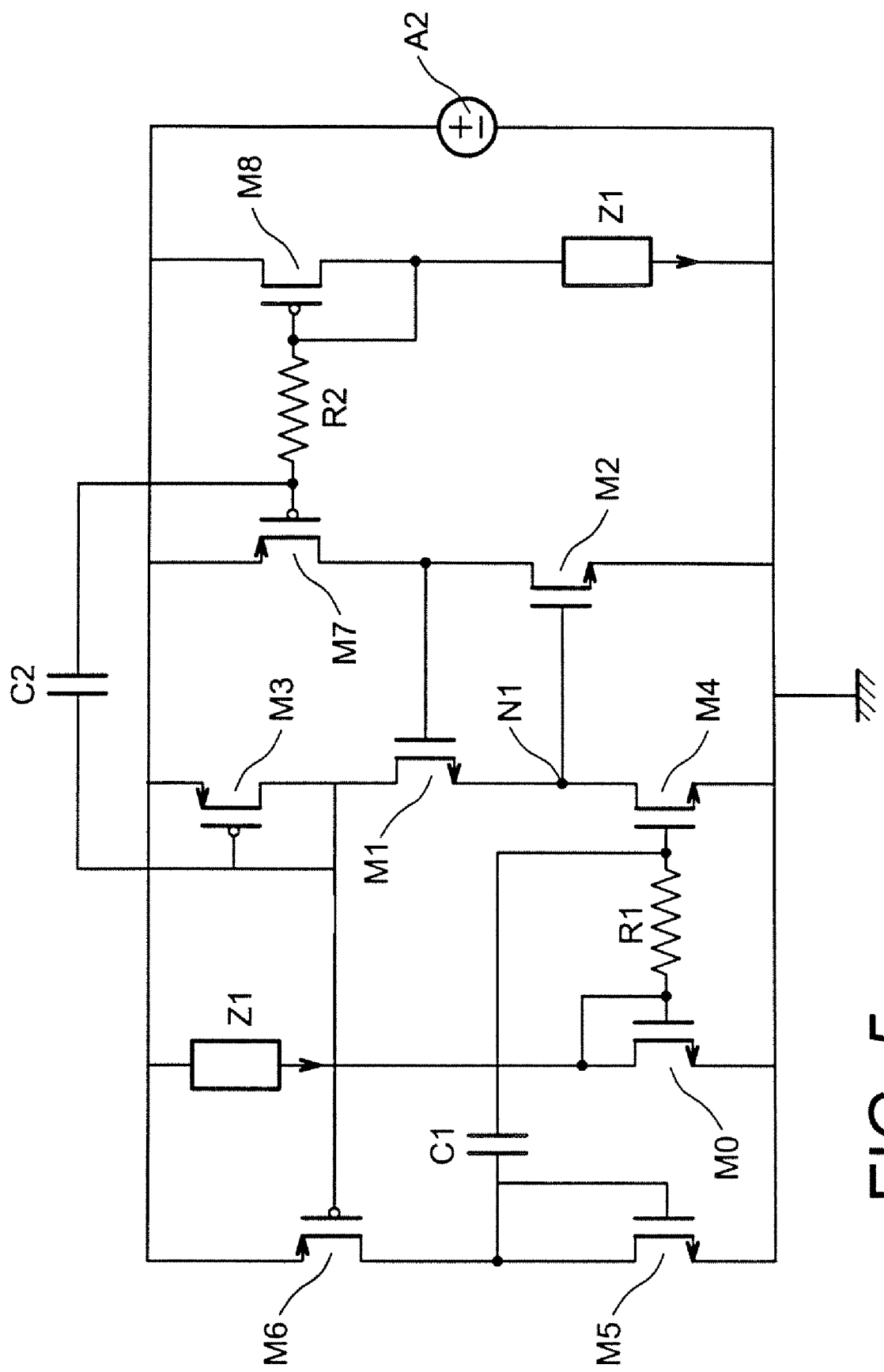
FIG. 5 shows a second example of the first electronic circuit that is part of the current comparator of the invention.

Similarly, it is advantageous to increase dynamically the polarisation current of the transistor M2, in order to increase the rapidity of the comparator. FIG. 5 shows a current preamplifier which creates, in addition to the dynamic increase of the current I1, the dynamic increase of the current I2.

In this example, the second current generator S2 is created using a current mirror. Moreover, other elements are added to the elements shown in FIG. 4, in order to create means of modifying the polarisation current I2 supplied by the second current generator S2. Consequently, the pre-amplifier shown in FIG. 7 further comprises two type P CMOS transistors M7 and M8, a resistor R2, a capacitor C2 and a load Z2. The transistor M7 is mounted in series with the transistor M2 at the terminals of the power supply A1. The transistor M8 and the load Z2 are placed in series at the terminals of the power supply A1. The transistor M8 is diode connected. The resistor R2 connects the gates of the transistors M7 and M8 so that the transistors M7 and M8 form a static current mirror. The static current passing through the transistor M7 copies the static current passing through the transistor M8. The capacitor C2 connects the gates of the transistors M7 and M3 so that the transistors M7 and M3 form a dynamic current mirror. The dynamic current passing through the transistor M7 copies the dynamic current passing through the transistor M3. As the transistor M7 is mounted in series with the transistor M2, the same static and dynamic currents pass through the transistors M7 and M2. The more the input current i3 increases, the more the current I2 passing through the transistors M7 and M2 increases, the more the reactivity of the pre-amplifier increases and the more the current i3 increases.

Generally, a pre-amplifier according to this invention comprises detection means of a current pulse at the input of the pre-amplifier and feedback means to increase the polarisation current of at least one of the transistors M2, M4 of the cascode stage of the pre-amplifier.

In the previous examples of circuits described, the detection means are created by the diode connected transistor M3. The transistors M5, M6, the capacitor C1 and the resistor R1 form feedback means to increase the polarisation current of the transistor M4. The capacitor C2 and the resistor R2 form feedback means to increase the polarisation current of the transistor M2.

Those skilled in the art could imagine other detection means for a current pulse at the input of the pre-amplifier as well as other feedback means to increase the polarisation current of the transistors of the cascode stage of the pre-amplifier.

According to an improvement of the invention, the current i3 supplied by the current pre-amplifier is dynamically converted into a voltage. This conversion permits, with respect to the comparators according to the prior art that are inverter based, to reduce further the static consumption.

Figure 6:
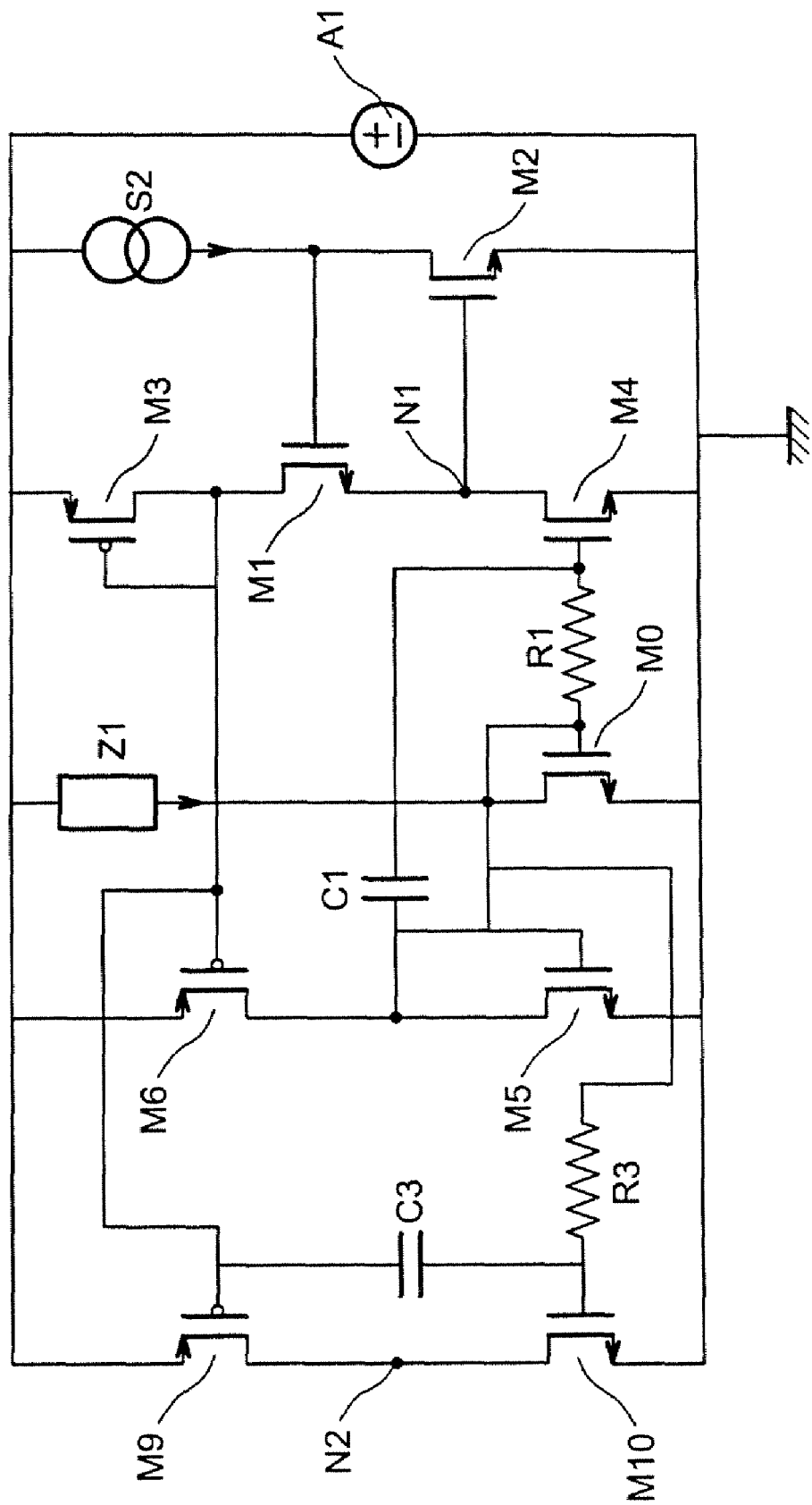
FIG. 6 shows an example of a second electronic circuit that is part of the current comparator of the invention.

By way of non restrictive example, FIG. 6 shows a current pre-amplifier according to the invention such as that shown in FIG. 4, to which is associated a current/voltage converter capable of reducing the static consumption. In addition to the elements shown in FIG. 4, the circuit of FIG. 6 comprises a type P CMOS transistor M9, a type N CMOS transistor M10, a resistor R3 and a capacitor C3. The transistors M9 and M10 are mounted in series at the terminals of the power supply A1, wherein the transistor drain M9 is connected to the transistor drain M10. The capacitor C3 connects directly the gates of the transistors M9 and M10. The gate of the transistor M9 is connected directly to the gate of the transistor M6 and the gate of the transistor M10 is connected to the gate of the transistor M0 via the resistor R3. The output voltage from the current/voltage converter is taken on the node N2 connecting the two drains of the transistors M9 and M10. By means of the connection between them (direct connection of the gates), the transistors M3 and M9 form a current mirror such that the static and dynamic currents passing through the transistor M9 copy the static and dynamic currents passing through the transistor M3. Moreover, by means of the connection between them (resistor R3 between the gates of the two transistors), the transistors M0 and M10 form a static current mirror such that the static current passing through the transistor M10 copies the static current passing through the transistor M0. Finally, by means of the connection between them (capacitor C3 between the gates of the two transistors), the transistors M3 and M10 form an "inverted" dynamic current mirror.

From the point of view of the static current, it follows that the transistors M9 and M10 have the same static current passing through them. The node N2 which is the common drain of these transistors is consequently a floating node positioned for example at mid-power supply when no dynamic current passes through the transistors M9 and M10.

From the point of view of the dynamic current, it follows that the transistors M9 and M10 each have a current proportional to the current i3 passing through them, wherein the variations of the dynamic current passing through the transistor M9 have a sign opposed to the variations of the dynamic current passing through the transistor M10, such that:

(a) if the current i3 increases, then the total current passing through the transistor M9 increases and the total current passing through the transistor M10 decreases, and (b) if the current i3 decreases, then the total current passing through the transistor M9 decreases and the total current passing through the transistor M10 increases.

In case (a), the voltage VN2 on the node N2 increases and in case (b), the voltage VN2 on the node N2 decreases.

Figure 7:
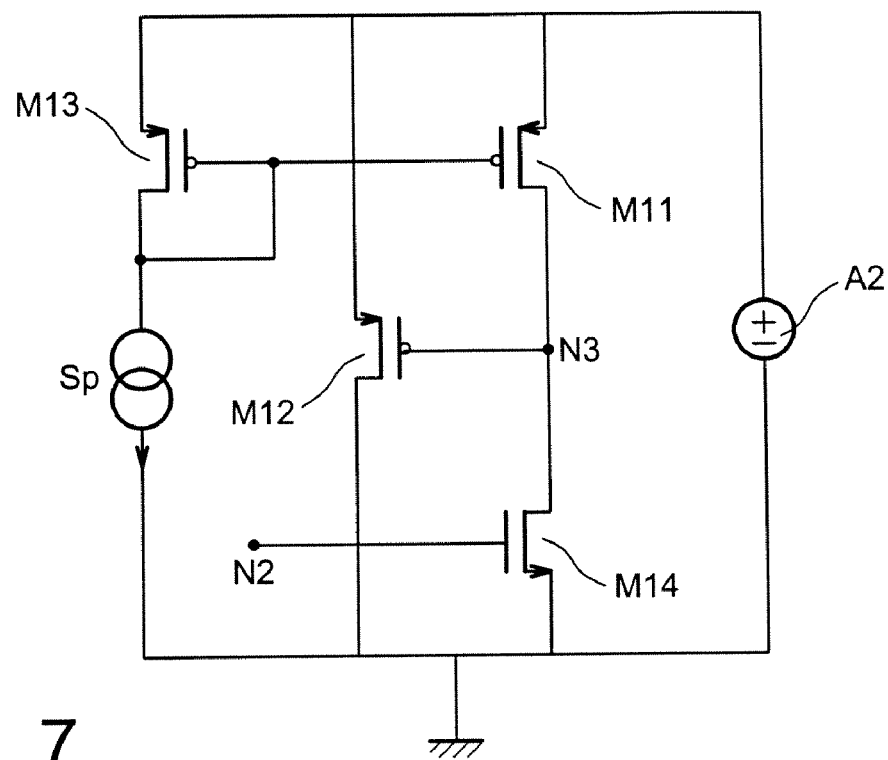
FIG. 7 shows a first example of a third electronic circuit that is part of the current comparator of the invention.
Figure 8:
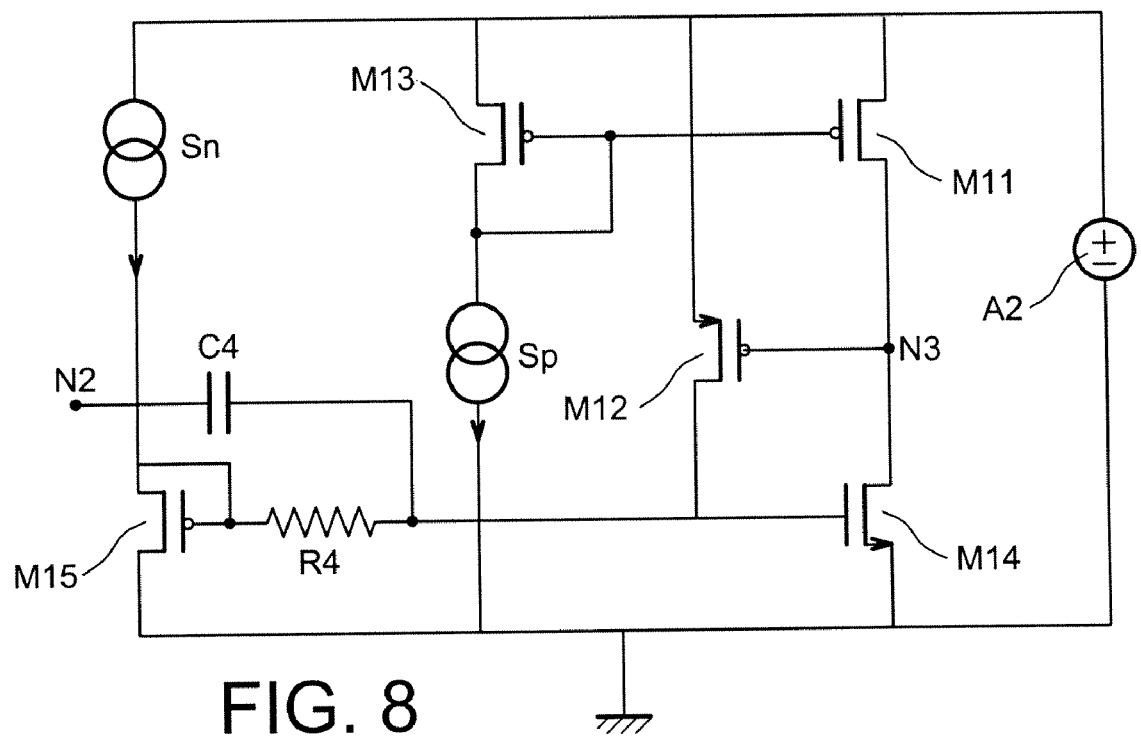
FIG. 8 shows a second example of the third electronic circuit that is part of the current comparator of the invention.

FIGS. 7 and 8 show two examples of voltage comparators used within the scope of the invention.

The voltage comparator shown in FIG. 9 comprises three type P CMOS transistors M11, M12, M13, a type N CMOS transistor M14, a current generator Sp supplying a current Ip and a power supply A2 possibly corresponding to the power supply A1. The diode connected transistor M13 and the current generator Sp are in series at the terminals of the power supply A2. The transistors M11 and M14 are mounted in series at the terminals of the power supply A2. The source of the transistor M12 is connected to the sources of the transistors M11 and M13, its drain is connected to the output node N2 of the current/voltage converter and its gate is connected to the common drain of the transistors M11 and M14, which forms the output node N3 of the comparator.

The signal which enters via the node N2 commands the transistor M14 mounted in common source that is polarised by the current passing through the transistor M11. When the voltage at the node N2 is fixed statically, the voltage at the node N3 is close to that of the power supply A2, such that the transistor M12 is not conductive. The transistor M12 introduces an avalanche effect such that its dynamic gain is added to the gain of the transistor M14. As soon as a signal appears on the node N2, the voltage on the node N3 "switches" to become substantially nil.

With this circuit, there is however a risk of the comparator switching, in the absence of a signal on the node N2. This depends in fact on the absolute dimension of the transistors M9 and M10 of the current/voltage converter with respect to that of the transistor M14. This switching may notably occur in the presence of interference on the node N2. To avoid the imprecision of the voltage VN2 of the node N2 before the arrival of a signal, due to a detection of a call current i3, a circuit such as that shown in FIG. 8 is advantageously envisaged.

In addition to the elements shown in FIG. 7, the circuit shown in FIG. 8 comprises a type N CMOS diode connected transistor M15, an additional current generator Sn supplying a current I, a resistor R4 and a capacitor C4. The additional current generator Sn and the transistor M15 are mounted in series at the terminals of the power supply A2. The resistor R4 is placed between the gates of the transistors M15 and M14 and the capacitor C4 has a first armature connected to the grill of the transistor M14 and a second armature connected to the node N2.

Under static load, the transistors M13 and M11 form a current mirror such that the static current passing through the transistor M11 copies the static current passing through the transistor M13. Also, the transistors M15 and M14 form a current mirror such that the static current passing through the transistor M14 copies the static current passing through the transistor M15. The current generators Sp and Sn are set such that the current Ip is greater than the current In, wherein the node N3 is then taken to the voltage of the power supply A2.

Under dynamic load, when a voltage pulse is created on the node N2, the current passing through the transistor M14 increases strongly as the voltage on the node N2 increases and unbalances the current mirror (M15, M14). Consequently, the voltage on the node N3 passes rapidly from the power supply voltage to the ground.

In the example of voltage comparator shown in FIG. 8, it may be noted that the current mirror formed by the transistors M11, M13 is not indispensable. Another type of current source could be placed in series with the transistor M14 at the terminals of the power supply A2.

Furthermore, in the examples of comparators shown in FIGS. 7 and 8, the current generators Sp and Sn may be formed by a simple resistive type load. As known to those skilled in the art, the current passing through the transistor M13 or M15 then becomes a function of the geometry of the transistor considered and of the value of the load connected to the latter. Inversely, the current generators S1 and S2 of the devices shown in FIGS. 3 to 6 could be formed by several current mirrors in series, wherein the loads Z1 and Z2 are then replaced by one or several other current mirrors.

Generally, the filtering resistors R1, R2, R3 and R4 mentioned above have high values. In order to limit the size of the circuit, they are preferably made using blocked MOS transistors. In fact, blocked MOS transistors have a very high impedance ranging from a few mega-ohms to several giga-ohms.

The current comparator of the invention has the advantage of having a very low consumption and advantageously using the working signal itself to index the dynamic consumption of the circuit and to make the comparison with great rapidity.

Furthermore, the different circuits previously described could be made using complementary logic, wherein the PMOS transistors are replaced by NMOS transistors and vice versa. In this case, the photodiode would be connected to a power supply voltage, and not to the ground, and the input node N1 of the pre-amplifier would receive a current i3 during the reception of a photon by the photodiode.

Furthermore, the circuits previously described could be made using other types of transistors such as MOS transistors, for example bipolar transistors.

In this application, it is meant by "transistor control terminal" the terminal that permits to decide on the conductive or non conductive state of the transistor. In the case of a MOS transistor, the command terminal is the gate of the transistor. In the case of a bipolar transistor, the command terminal is the base.

Moreover, this invention may be used to detect a variable current, of the pulse type, that may be requested or supplied by other photo-detectors than a photodiode. By pulse type variable current, it is meant any current with high frequency variations.

Furthermore, the examples of circuits previously described may be powered by a single power supply or by different power supplies.

The invention claimed is:

1. A current pre-amplifier with an input capable of receiving or supplying an input current with at least one pulse, wherein the pre-amplifier comprises a regulated cascode stage comprising an input transistor and a first current generator in series at the terminals of a power supply, as well as an output transistor and a second current generator in series at the terminals of said power supply, wherein the first intermediate node between the first current generator and the input transistor forms said input and is connected to the command terminal of the output transistor, wherein the second intermediate node between the second current generator and the output transistor is connected to the command terminal of the input transistor, wherein said current pre-amplifier comprises:
   detection means for detecting an input current pulse, and
   first feedback means for increasing the current supplied by the first current generator during the entire detection of the input current pulse.

2. A current pre-amplifier according to claim 1, further comprising second feedback means for increasing the current supplied by the second current generator during the entire detection of an input current pulse.

3. A current pre-amplifier according to claim 1, wherein the detection means detecting an input current pulse comprise a diode connected to a detection transistor placed between said input transistor and a terminal of said power supply.

4. A current pre-amplifier according to claim 2, wherein the first current generator comprises first and second current mirror mounted transistors, wherein the first current mirror mounted transistor is placed between the input of the pre-amplifier and a terminal of said power supply, wherein the second current mirror mounted transistor is a diode and has a pre-defined polarisation current passing through said diode.

5. A current pre-amplifier according to claim 4, wherein the first feedback means comprise:
   a third transistor connected to the detection transistor in the form of a current mirror, wherein the command terminal of the third transistor is connected to the command terminal of the detection transistor,
   a fourth diode connected transistor placed in series with the third transistor at the terminals of said power supply,
   a first capacitor placed between the command terminals of the first and fourth transistors, and
   a first resistor placed between the command terminals of the first and second transistors.

6. A current pre-amplifier according to claim 5, wherein the second current generator comprises fifth and sixth current mirror mounted transistors, wherein the fifth transistor is placed between said second intermediate node and a terminal of said power supply, wherein the sixth transistor is another diode and has a pre-defined polarisation current passing through said another diode.

7. A current pre-amplifier according to claim 6, wherein the second feedback means comprise:
   a second capacitor placed between the command terminals of the detection transistor and the fifth transistor, and
   a second resistor placed between the command terminals of the fifth and sixth transistors.

8. A current comparator featuring a current pre-amplifier and a current/voltage converter in series with the current pre-amplifier, wherein the current pre-amplifier is a pre-amplifier according to claim 2.

9. A current comparator according to claim 8, wherein the current/voltage converter comprises first and second additional transistors of different types mounted in series at the terminals of said power supply, wherein the additional transistors are connected to an output node of the current/voltage converter, wherein a capacitor connects the command terminals of the additional transistors, wherein the command terminals of the detection transistor and the first additional transistor are connected to one another, wherein one resistor is placed between the command terminals of said second transistor and the second additional transistor.

10. A current comparator according to claim 8, wherein a voltage comparator is in series with the converter voltage/current.

11. A current comparator according to claim 10, wherein the voltage comparator comprises:
   a first transistor of a first type in series with a first current source at the terminals of a power supply, wherein the intermediate node between the first transistor and the first current source form the output of the voltage comparator,
   a second transistor of a second type placed between a terminal of said power supply and the command terminal of the first transistor, wherein the command terminal of the second transistor is connected to said output of the voltage comparator,
   a third diode connected transistor of the first type, wherein the third transistor is in series with a current source at the terminals of said power supply,
   a resistor placed between the command terminals of the first and third transistors, and
   a capacitor placed between the command terminal of the first transistor and the input of the voltage comparator,
   in which the input of the voltage comparator is connected to the output node of the current/voltage converter.

12. A photonic integration circuit comprising a current comparator, wherein the current comparator is a comparator according to claim 8.

13. A current pre-amplifier with an input capable of receiving or supplying an input current with at least one pulse, wherein the pre-amplifier comprises a regulated cascode stage comprising an input transistor and a first current generator in series at the terminals of a power supply, as well as an output transistor and a second current generator in series at the terminals of said power supply, wherein the first intermediate node between the first current generator and the input transistor forms said input and is connected to the command terminal of the output transistor, wherein the second intermediate node between the second current generator and the output transistor is connected to the command terminal of the input transistor, wherein said current pre-amplifier comprises:
   detection means for detecting an input current pulse, and
   feedback means for increasing the current supplied by the second current generator during the entire detection of an input current pulse.

14. A current pre-amplifier according to claim 13, wherein the detection means for detecting an input current pulse comprise a diode connected to a detection transistor placed between said input transistor and a terminal of said power supply.

15. A current pre-amplifier according to claim 13, wherein the first current generator comprises first and second mirror mounted transistors, wherein the first current mirror mounted transistor is placed between the input of the pre-amplifier and a terminal of said power supply, wherein the second current mirror mounted transistor is a diode and has a pre-defined polarization current passing through said diode.

16. A current comparator featuring a current pre-amplifier and a current/voltage converter in series with the current pre-amplifier, wherein the current pre-amplifier is a pre-amplifier according to claim 13.

17. A photonic integration circuit comprising a current comparator, wherein the current comparator is a current comparator according to claim 16.

* * * * *